United States Patent
Grundbacher

(10) Patent No.: US 6,874,576 B2
(45) Date of Patent: Apr. 5, 2005

(54) DEVICE FOR COOLING ELECTRIC OR ELECTRONIC DEVICES

(75) Inventor: Johann Grundbacher, Schliersee (DE)

(73) Assignee: Infineon Technologies AG, Munich (DE)

( * ) Notice: Subject to any disclaimer, the term of this patent is extended or adjusted under 35 U.S.C. 154(b) by 65 days.

(21) Appl. No.: 10/202,704

(22) Filed: Jul. 24, 2002

(65) Prior Publication Data
US 2003/0019611 A1 Jan. 30, 2003

(30) Foreign Application Priority Data
Jul. 24, 2001 (DE) ........................................ 101 36 006

(51) Int. Cl.⁷ ............................................... H05K 7/20
(52) U.S. Cl. ..................... 165/299; 165/80.3; 165/80.4; 165/104.14; 361/697
(58) Field of Search .............................. 165/80.3, 80.4, 165/121, 104.13, 104.14, 104.33, 104.34, 299, 300; 361/697, 699

(56) References Cited

U.S. PATENT DOCUMENTS

| | | | | |
|---|---|---|---|---|
| 3,305,813 A | * | 2/1967 | Toothman et al. | ........... 336/100 |
| 3,481,393 A | * | 12/1969 | Chu | ........... 165/80.4 |
| 3,843,910 A | * | 10/1974 | Ringuet | ........... 361/696 |
| 3,956,673 A | | 5/1976 | Seid | |
| 4,365,666 A | * | 12/1982 | Seifert | ........... 165/104.29 |
| 5,052,472 A | * | 10/1991 | Takahashi et al. | ........... 165/299 |
| 5,269,146 A | * | 12/1993 | Kerner | ........... 62/3.6 |
| 5,509,468 A | * | 4/1996 | Lopez | ........... 165/144 |
| 5,806,583 A | * | 9/1998 | Suzuki et al. | ........... 165/104.33 |
| 6,131,647 A | * | 10/2000 | Suzuki et al. | ........... 165/104.33 |
| 6,164,369 A | * | 12/2000 | Stoller | ........... 165/104.33 |
| 6,205,803 B1 | * | 3/2001 | Scaringe | ........... 62/59.2 |
| 6,397,933 B1 | * | 6/2002 | Enlund | ........... 165/104.13 |
| 2001/0052412 A1 | * | 12/2001 | Tikka | ........... 165/299 |

FOREIGN PATENT DOCUMENTS

| | | | |
|---|---|---|---|
| DE | 148 703 | 6/1981 | |
| DE | 41 25 528 C2 | 2/1992 | |
| DE | 43 27 444 A1 | 2/1995 | |
| DE | 199 20 186 A1 | 12/2000 | |
| EP | 0 406 763 A2 | 1/1991 | |
| GB | 1 521 464 | 8/1978 | |
| JP | 58-006336 A | * 1/1983 | ............. F24F/3/00 |

* cited by examiner

*Primary Examiner*—Allen J Flanigan
(74) *Attorney, Agent, or Firm*—Laurence A. Greenberg; Werner H. Stemer; Ralph E. Locher

(57) ABSTRACT

A device for cooling electric or electronic devices includes a heat exchanger and a adapter means connected to the heat exchanger via a fluid line for connecting the heat exchanger to the electric or electronic device. The heat exchanger, the fluid line and the adapter means contribute to a closed fluid circuit through which a primary fluid may be driven from an output of the heat exchanger to the device and from the device to the heat exchanger, so that waste heat from the device may be transported to the heat exchanger and there be given off to a secondary fluid.

7 Claims, 1 Drawing Sheet

DEVICE FOR COOLING ELECTRIC OR ELECTRONIC DEVICES

FIELD OF THE INVENTION

This invention relates to a device for cooling electric or electronic devices and in particular to such a device suitable for cooling existing electric or electronic devices, for example existing test systems.

BACKGROUND OF THE INVENTION AND PRIOR ART

Air cooled testers, i.e. for example test devices for quickly testing a plurality of integrated circuits in a parallel or consecutive way, could only be used restrictedly up to now due to the heat and noise development in laboratory operation. An example for such a tester is the tester J750 by the Teradyne company. Such relatively cost effective testers which are also suitable as laboratory testers due to their size and mobility are relatively loud due to the air cooling and produce waste heat which heats up the room in which the tester is operated. This leads to a strong heating up of the room in which the tester is operated which can generally not be absorbed by a room air conditioning system.

Up to now there has been no solution on the market for the above described problem, so that testers of the mentioned type are only restrictedly applicable in the laboratory area.

SUMMARY OF THE INVENTION

It is the object of the present invention to provide a device for cooling allowing the use of electric or electronic devices in the laboratory area which were up to now only restrictedly useable in the laboratory area due to noise emission and heat exposure.

In accordance with the present invention, this object is achieved by a device for cooling electric or electronic devices, comprising:

a heat exchanger;

an adapter means for connecting the heat exchanger to the electric or electronic device connected to the heat exchanger via a fluid line, wherein the heat exchanger, the fluid line and the adapter means from part of a closed fluid circuit through which a primary fluid may be driven from an output of the heat exchanger to the device and from the device to an input of the heat exchanger, so that waste heat from the device is transportable to the heat exchanger and may there be given off to a secondary fluid.

The present invention is based on the findings that on the one hand a major reduction of the heat load in a room may be reached, in which an electric or electronic device is operated, for example an air cool tester, and on the other hand that a major reduction of the noise emission of the electric and/or electronic device may be reached if a device for cooling is used providing a closed circuit for removing waste heat produced by the electric and/or electronic device. In an inventive device for cooling an actually air cooled electric or electronic device, for example the air cooled tester, two connection means of the adapter means of the inventive device are attached to the cooling openings in the casing of the device originally provided for the air cooling of the electric or electronic device, so that the original cooling system of the air cooled electric or electronic device is integrated in the closed fluid circuit of the inventive device and is part of the fluid circuit.

As mentioned above, the present invention is especially suitable for improving the cooling of air cooled electric or electronic devices, wherein the secondary fluid to which the waste heat is given off in the heat exchanger is preferably a cooling liquid and most preferably water.

By the provided inventive closed fluid circuit a large part of the noise stays "within" the electric or the electronic device as the cooling openings which present output openings for the noise created in the electric or electronic device are closed by the adapter means of the inventive device. Further, the created waste heat is given off via the heat exchanger, an air/water heat exchanger in the preferred embodiments. Therefore, both the noise emission and the heat load may be reduced to a tolerable value by the present invention.

The inventive device may preferably comprise a blower in order to support a fluid stream of the primary fluid through the closed fluid circuit. Further, the inventive device may include a controller and a temperature sensor in order to regulate the temperature of the primary fluid at the output of the heat exchanger. This regulation may preferably be caused by a regulating valve provided for setting a flow rate of the secondary fluid through the heat exchanger, so that by setting the flow rate, the heat absorption of the secondary fluid and thereby the temperature of the primary fluid may be set at the output of the heat exchanger.

Despite this advantages that were reached, the electric or electronic devices provided with the inventive device for cooling are preferably mobile, as the cooling unit of the inventive device, for example consisting of the heat exchanger, the blower and the control means is preferably designed drivable and is exclusively connected to the electric or electronic device to be cooled via the fluid line and/or the fluid lines which are preferably realised by two flexible tubes.

Further embodiments of the present invention are described in the dependent claims.

BRIEF DESCRIPTION OF THE DRAWINGS

One preferred embodiment of the present invention is in the following described referring to the accompanying drawing.

The accompanying drawing shows a schematic diagram of a preferred embodiment of an inventive device for cooling an air cooled tester.

DETAILED DESCRIPTION OF PREFERRED EMBODIMENTS

Figure 1:
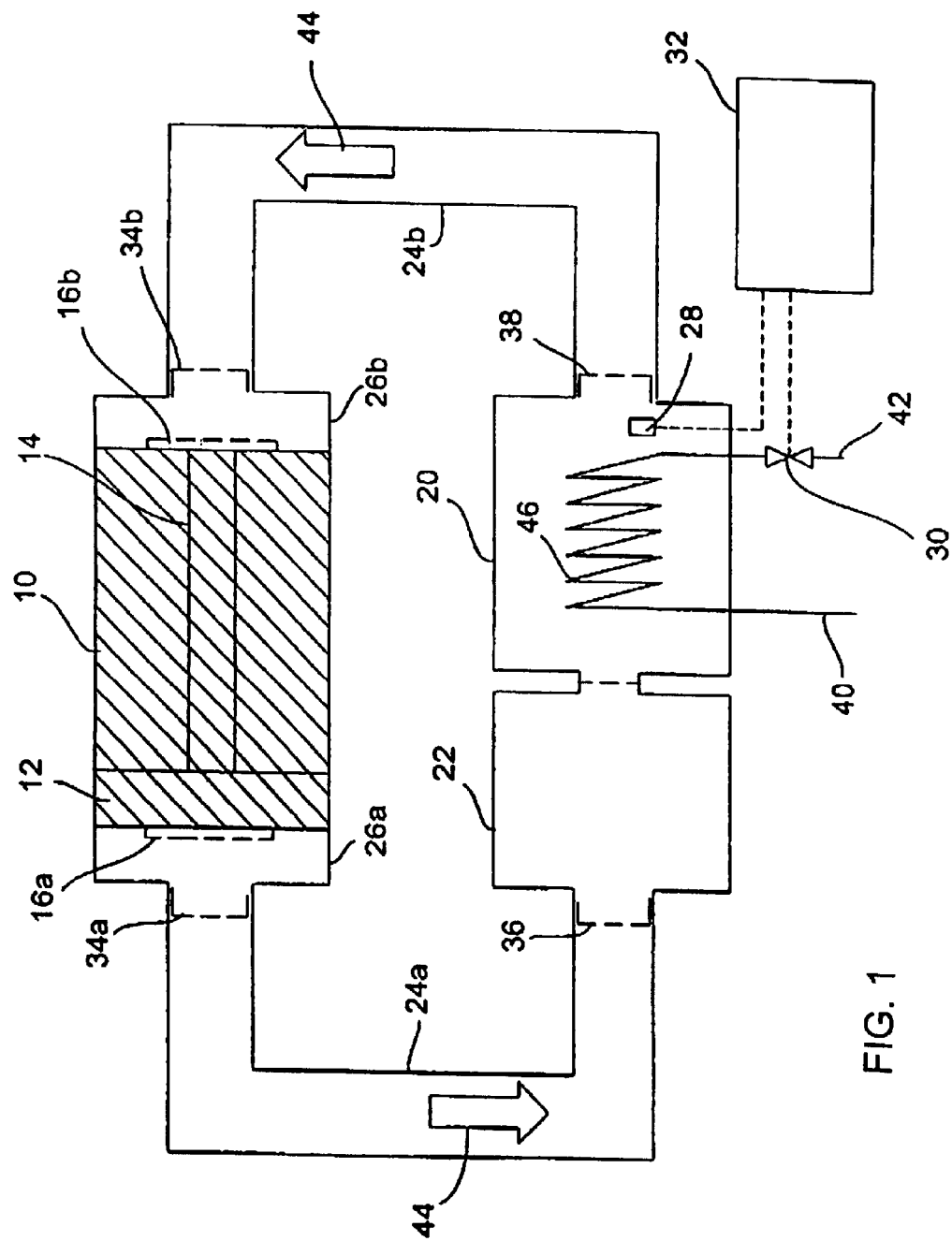

In the FIGURE a conventional air cooled tester 10 is shown schematically, which may for example be a J750 tester by the company Teradyne. In the FIGURE the parts associated with the conventional air cooled tester 10 are illustrated hatched. The tester 10 includes a casing in which the whole electric and/or electronic equipment for performing any different tests for example on integrated circuits or similar things is arranged. In the casing 10 also a cooling system is located which serves for air cooling the tester. Components of this cooling system are schematically shown in FIG. 10 and include a ventilator 12, an air cooling path 14 and cooling openings 16a and 16b. The above mentioned elements are illustrated purely schematically in the FIGURE, wherein its special arrangement is not critical for the present invention and reference is for example made to the above mentioned tester of the company Teradyne regarding this arrangement. In operation, the conventional air cooled tester 10 produces waste heat which is given off to the environment, for example the room in which the tester is operated, through the cooling openings 16a and 16b, if the inventive device is not present.

The illustrated embodiment of the present invention now includes a cooling device for such a tester comprising a heat exchanger 20, a blower 22, two fluid lines 24a and 24b in the form of flexible tubes, two adapter sheets 26a and 26b, a temperature sensor 28, an automatic regulating valve 30 and a controller 32.

The adapter sheets 26a and 26b illustrate means for attaching the inventive cooling device to the tester 10. For this purpose the adapter sheets 26a and 26b may be provided with suitable locking means (not shown) which allow mounting the same to the tester 10. Such locking means may for example be quick locks through which the adapter sheets 26a and 26b may be mounted to the tester 10. It is to be noted here that the construction of the locking means for mounting the adapter sheets to the tester 10 are not critical for the present invention as long as such a connection to the tester is possible by these locking means and the adapter sheets, such, that a fluid communication between the cooling openings 16a, 16b and the fluid lines 24a, 24b is realised and a substantially fluid tight sealing to the outside may be reached by the connection. Any clipped or screwed connection and the like may be used for this.

The adapter sheets 26a, 26b which may consist of any suitable material include one connector piece 34a and/or 34b each in the illustrated embodiment, through which the fluid line 24a and/or 24b is connected to the adapter sheet 26a and/or 26b.

The heat exchanger 20, the blower 22, the temperature sensor 28, the automatic regulating valve 30 and the controller 32 are in the following together referred to as a cooling unit. The cooling unit comprises a connector piece 36 to which a second end of the fluid line 24 is connected. The blower 22 provided for overcoming the increased air resistance caused by the provided inventive closed fluid circuit is in fluid communication with the connector piece 36 and the heat exchanger 20, which is in turn in fluid communication with the connector piece 38, so that a continuous fluid communication between the connector piece 36 and the connector piece 38 is implemented.

The heat exchanger 20 includes a flow line 40 for the secondary fluid used, which is preferably a cooling agent and most preferably water. The temperature of the cooling agent in the flow line 40 may for example be 14° C. Further, the heat exchanger includes a return line 42, wherein the flow rate through the return line 42 may be set by the same using the automatic regulating valve 30. The temperature sensor 28 is arranged to detect the temperature of a primary fluid, air in the preferred embodiment, at the outputs of the heat exchanger which is used for cooling the tester 10. The temperature sensor 28 and the automatic regulating valve are connected to the controller 32.

By the above described construction the inventive cooling device provides a closed fluid circuit for the tester 10, beginning at the connector piece 38, through the fluid line 24b, via the connector piece 34b through the cooling openings 16b, along the air cooling path 14 of the tester, through the cooling openings 16a via the connector 34a, along the fluid line 24a through the connector 36, via the blower to the heat exchanger 20 and through the connector 38 of the same again into the fluid line 24b.

A stream 44 of the primary fluid, an air stream in the preferred embodiments of the present invention, is obtained by the ventilator 12 in the air cooled tester 10. If this ventilator 12 is not sufficient to overcome the increased resistance caused by the inventive closed fluid circuit, a blower 22 may optionally be provided to support the stream 44, as in the illustrated embodiment.

In operation the tester, i.e. the therein contained electric and/or electronic components, produce waste heat which is absorbed by the primary fluid. The primary fluid heated up by the waste heat of the tester, streams through the heat exchanger 20 and gives off its heat energy to the secondary fluid circuit. For this purpose the secondary fluid line 46 is arranged in the flow path of the primary fluid stream 44 in a known way, for example in the form of a meander. Only the flow line 40, the secondary fluid line 46 and the return line 42 of the secondary fluid circuit are shown, wherein the construction of such a secondary fluid circuit is known to those skilled in the art and therefore need not be explained any further.

The temperature of the primary fluid, i.e. of the air in the illustrated embodiment, after the heat exchanger 20 and/or at its output is detected by the sensor 28 connected to the controller 32, regulating the throughput of the secondary fluid via the regulating valve 30, the water throughput of the heat exchanger 20 in the illustrated embodiment, to maintain the primary fluid temperature at the output of the heat exchanger at a constant value.

Through the inventive cooling device the noise of the tester 10 is reduced considerably, as the sounds within the closed circuit breaks and reaches the outside only strongly reduced. Substantially, the described heat exchanger is also suitable for other air cool systems, wherein only the adapter sheets, i.e. the means for connecting the fluid lines to the respective system, need to be adapted.

In the above described embodiment air is used as a primary fluid and water is used as a secondary fluid. It is obvious, however, that other fluids may be used as primary fluids and secondary fluids, wherein as a primary fluid preferably such a fluid is used, as it is used for cooling the electric or the electronic device to which the inventive device is to be connected. Any cooling liquid and/or any cooling gas may be used as a secondary fluid, wherein the use of water as secondary fluid will prove to be sufficient in most cases.

In the illustrated embodiment the air cooling path of the device connected to the inventive means is part of the closed fluid circuit. Alternatively, the adapter means may be adapted according to the invention to define a closed fluid circuit, wherein fluid paths are lead around the electric or electronic device to be cooled, however do not penetrate it. Also in such a case the inventive advantages of the reduced heat development and noise development may be achieved, even if only to a restricted extent.

What is claimed is:

1. A device for cooling electric or electronic devices, comprising
    a heat exchanger having an output and an input;
    an adapter connected to said heat exchanger via a fluid line for connecting said heat exchanger to the electric or electronic device;
    said heat exchanger, said fluid line and said adapter forming a closed fluid circuit, conducting a primary fluid driven from said output of said heat exchanger to the device and from the device to said input of said heat exchanger through said closed fluid circuit, causing waste heat from the device to be transported to said heat exchanger and given off to a secondary fluid in said heat exchanger;

a controller and a temperature sensor for regulating a temperature of said primary fluid at said output of said heat exchanger; and a regulating valve for setting a flow rate of said secondary fluid through said heat exchanger to thereby set the temperature of said primary fluid at said output of said heat exchanger.

2. The device according to claim 1, wherein said adapter includes at least two connectors for a connection to the electric or electronic device and a cooling system of the electric or electronic device forms part of said closed fluid circuit in a connected state of said connectors.

3. The device according to claim 1, wherein said primary fluid is air and said secondary fluid is a cooling liquid.

4. The device according to claim 3, wherein said cooling liquid is water.

5. The device according to claim 2, wherein said primary fluid is air and said connectors are formed to be connected to cooling openings of an air cooled electric or electronic device in a manner sealing to the outside.

6. The device according to claim 1, further comprising a fan to support a stream of said primary fluid in said closed fluid circuit.

7. The device according to claim 1, wherein said fluid line as formed by a flexible tube.

* * * * *